US 6,268,813 B1
Jul. 31, 2001

(54) SELF-TEST FOR CHARGE REDISTRIBUTION ANALOG-TO-DIGITAL CONVERTER

(75) Inventor: Michiel de Wit, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/143,025

(22) Filed: Aug. 28, 1998

Related U.S. Application Data

(60) Provisional application No. 60/057,577, filed on Aug. 29, 1997.

(51) Int. Cl.[7] ........................................... H03M 1/10
(52) U.S. Cl. ............................................ 341/120; 341/144
(58) Field of Search ........................... 341/172, 144, 341/155, 163, 120

(56) References Cited

U.S. PATENT DOCUMENTS

| | | | |
|---|---|---|---|
| 4,399,426 | 8/1983 | Tan | 340/347 |
| 4,404,544 | * 9/1983 | Dwarakanath | 341/172 |
| 4,679,028 | 7/1987 | Wilson et al. | 340/347 |
| 4,764,753 | * 8/1988 | Yukawa | 341/172 |
| 4,831,381 | * 5/1989 | Hester | 341/172 |
| 5,258,761 | * 11/1993 | Fotoubi et al. | 341/172 |
| 5,416,485 | * 5/1995 | Lee | 341/72 |

OTHER PUBLICATIONS

"All–MOS Charge Redistribution Analog–to–Digital Conversion Techniques", McCreary et al., IEEE Journal of Solid State Circuits, vol. SC–10, No. 6, Dec. 1975, pp. 371–379.

* cited by examiner

*Primary Examiner*—Peguy JeanPierre
(74) *Attorney, Agent, or Firm*—Warren L. Franz; Wade James Brady, III; Frederick J. Telecky, Jr.

(57) ABSTRACT

An analog-to-digital converter has a binary weighted capacitor array with one plate of each capacitor connected at an input to a comparator and successive approximation logic circuitry provided for selectively connecting the capacitors to high reference, low reference or analog input signal voltage to develop a digital output in a successive charge redistribution conversion process. An on-board test data generator provides a test input voltage signal for a test mode. The other plate of each capacitor is selectively connected to the high or low reference voltage to charge the capacitors separately according to a prestored or externally supplied test pattern sequence. The digital output obtained from applying the usual sample, hold and charge redistribution process to the internally supplied test signal is compared to an expected digital output for an input signal corresponding to the predetermined test pattern sequence.

10 Claims, 2 Drawing Sheets

SELF-TEST FOR CHARGE REDISTRIBUTION ANALOG-TO-DIGITAL CONVERTER

This application claims priority under 35 USC 119(e)(1) of provisional application Ser. No. 60/057,577 filed Aug. 29, 1997.

The present invention relates generally to analog-to-digital converters (ADCs) and, in particular, to apparatus and methods providing self-testing for successive approximation ADCs of the charge redistribution, weighted capacitor array type.

BACKGROUND OF THE INVENTION

A successive approximation ADC produces an n-bit digital output by comparing a sampled and held analog input signal with the output of an internal digital-to-analog converter (DAC), using a successive approximation logic and registers controlled in such a way that the DAC output value converges towards the held input value. This is typically accomplished by splitting the voltage range in half in consecutive clock cycles to determine where the input signal lies. Thus, an eight-bit successive approximation ADC, for example, converges to a final result by taking eight consecutive "guesses," or successive approximations. An example of such ADC is described in U.S. Pat. No. 4,679,028, incorporated herein by reference.

One approach to successive approximation ADCs is the charge redistribution, weighted capacitor array ADC, an example of which is described in James L. McCreary and Paul R. Gray, "All-MOS Charge Redistribution Analog-to-Digital Conversion Techniques," *IEEE Journal of Solid State Circuits*, Vol. SC-10, No. 6, December 1975, at pages 371–379 and U.S. Pat. No. 4,399,426, both incorporated herein by reference. In this approach, a plurality of capacitors are used as the precision elements of a charge redistribution array and given binary weighted values. The capacitors are charged by the analog input signal, then sequentially switched for successive comparisons of the stored input signal with corresponding successive divisions (halvings) of an applied reference signal. The sequence of comparator outputs from the comparison steps provides the sequence of digital output bits, most to least significant bit, of the digital word representation of the analog input.

FIG. 1 shows a charge redistribution analog-to-digital converter (ADC) 10 in accordance with the prior art. ADC 10 has a capacitor array 12 interconnected via conductor 14 to a comparator 16. The output 18 of comparator 16 is connected to control, sequence and storage circuit 20 which produces the digital data bits output on DATA OUT lines 22a through 22e. Circuit 20 is comprised of successive approximation logic circuits which activate, control and sequence switches (such as MOS transistor switches) via conductors 24a through 24n to capacitor array 12.

As shown in FIG. 2, capacitor array 12 is comprised of a plurality of capacitors 26–36, connected in parallel. Capacitors 26–34 are binary weighted so that capacitor 26 corresponding to the most significant bit (MSB) has the largest value (16C), capacitor 28 corresponding to the next bit has a value (8C) which is one-half the value of capacitor 26, capacitor 30 corresponding to the next bit has a value (4C) which is one-half the value of capacitor 28, capacitor 32 corresponding to the next bit has a value (2C) which is one-half the value of capacitor 30, and capacitor 34 which corresponds to the least significant bit (LSB) has a value (C) which is one-half the value of capacitor 32. There is one additional capacitor 36 having the same value (C) as the value of the least significant bit capacitor 34.

Capacitors 26–36 have their top plates commonly connected to line 42 to one input (the non-inverted input) of voltage comparator 16 and to a switch S1 which, when connected to point A, is open and, when connected to point B, is closed to connect the top plates to ground. The bottom plates of capacitors 26–36 are connected to switches S2–S7, respectively, which may alternately be connected to point A which is connected to ground or to point B which is connected to switch S8. Switch S8 may be alternately connected to point A which is connected to an input terminal for receipt of voltage $V_{IN}$ to be digitized, or to point B which is connected to a reference voltage terminal for receipt of a reference voltage $V_{REF}$.

Analog-to-digital conversion is accomplished by three operations: sample, hold and redistribution. In sample mode, switches S1–S7 are set to points B, and switch S8 is set to point A. This grounds the top plates of capacitors 26–36 and charges their bottom plates to potentials proportional to the analog input $V_{IN}$. In hold mode, switches S1–S7 are set to points A, which disconnects line 14 from ground and connects the bottom plates of capacitors 26–36 to ground. Since the voltage cannot change instantaneously across capacitors 26–36, the potential at analog summing node 42 goes to $-V_{IN}$. Finally, in redistribution mode, the successive approximation technique is utilized to determine the data bits for the digital conversion.

Successive approximation begins by testing the value of the most significant bit (MSB). Switches S2 and S8 are set to points B, connecting $V_{REF}$ to the bottom plate of capacitor 26. Switch S1 remains in its A position. The remaining switches S3–S7 remain set to points A. This establishes a voltage divider circuit between two equal capacitances, capacitor 26 (16C) connected between $V_{REF}$ and node 42, and capacitors 28–36 (8C+4C+2C+C+C=16C) connected between node 42 and ground. The voltage $V_X$ (at summing node 42 which inputs to comparator 16), which was equal to $-V_{IN}$ previously, is now increased by one-half the reference voltage $V_{REF}$ to $V_X=-V_{IN}+V_{REF}/2$. Comparator 16 senses the polarity of $V_X$ and outputs a logic "1" if $V_X<0$ and a logic "0" if $V_X>0$. This determines the value of the most significant or 4th bit "b4". Thus, MSB=1 if $V_{IN}>V_{REF}/2$ and MSB=0 if $V_{IN}<V_{REF}/2$. The output on conductor 18 (FIG. 1) is the value of the binary bit being tested. Switch S2 is returned to point A (ground) if the MSB=0, or left at point B ($V_{REF}$) if the MSB=1.

In a similar manner, the next MSB is determined by setting switch S3 to point B to connect the bottom plate of the next largest capacitor (viz. capacitor 28) to $V_{REF}$, and checking the polarity of the resulting value of $V_X$ produced at node 42. Here, the voltage division property of capacitor array 12 causes $V_{REF}/4$ to be added to $V_X$:

$$V_X=-V_{IN}+(b4\times V_{REF}/2)+V_{REF}/4.$$

Comparator 16 will again output a logic 1 if $V_X<0$ and a logic 0 if $V_X>0$. This determines the value of the next most significant or 3rd bit "b3". Thus, b3=1 if $V_{IN}>(b4\times V_{REF}/2)+V_{REF}/4$ and b3=0 if $V_{IN}<(b4\times V_{REF}/2)+V_{REF}/4$. The output on conductor 18 (FIG. 1) gives the value of the next MSB binary bit being tested. Switch S3 is returned to point A (ground) if b3=0, or left at point B ($V_{REF}$) if b3=1.

Conversion proceeds in this manner until all bits in the digital representation have been determined. The final configuration of the capacitor array 12 will have those switches S2–S6 that correspond to bits of logic 0 set to point A, and those that correspond to bits of logic 1 left at point B. Thus, n redistributions are required for a conversion resolution of n bits. The logic outputs from comparator 16 serve as inputs to activate, control and sequence the positionings of switches S1–S8.

In the prior art, the most common method utilized for diagnostic testing of successive approximation ADCs is off-line testing. A known analog voltage input signal $V_{IN}$ is injected at the ADC input and converted to a digital value. The observed actual digital output word resulting from the conversion is then compared with the expected known correct digital result. If the actual digital output differs from the correct digital output, the components are trimmed, and the process repeated until the actual output matches the expected output to within acceptable tolerance. Such off-line testing is performed at the manufacturing site and is time consuming. For example, 256 ($2^8$) different codes must be checked for an eight-bit word output converter. It also requires a very accurate voltage source for the externally applied analog input signal. In production testing, where probe application is common, ensuring accuracy of the applied calibration voltage is not easy. You may get an accurate source, but you may have a lot of noise on it. Since analog voltages to be converted are typically divided up into 256 ($2^8$) digital levels, if a 5-volt reference $V_{REF}$ is used, the differences in applied testing voltage levels can be as small as 20 mV. These voltage levels can be easily swamped by noise. Therefore, it is desirable to have an ADC which does not need to use precision external signal sources for testing of its components.

In the past, ADCs have been manufactured as discrete, stand-alone chips because they are very precise elements and need to be isolated from "noise" (interfering) producing circuits, like digital microprocessors. If the ADC is a stand-alone device, some testing is already done which is reasonably quick and it may not be worthwhile to do any additional testing. In order to achieve higher densities and reduced cost, however, it is desirable to achieve an ADC which can be integrated onto a single chip with a noisy circuit, such as a microprocessor. However, once it is integrated with the microprocessor, conventional quick testing for the ADC can no longer be done. If an exhaustive test or a dynamic test including a signal-to-noise (SNR) test is to be done on an eight-bit ADC, then the test may consist of some 10,000 conversions.

Prior art built-in self-testing capabilities for ADCs test only the digital parts of the ADC, with digital test strategies being limited to things such as read/write capability of registers on the data bus and/or a scan path for other latches. An example of an integrated circuit including an ADC with this type of built-in self-testing logic is the TLC 1540 component manufactured by Texas Instruments Incorporated. However, the built-in self-testing logic on this chip leaves the analog parts of the converter (the comparator and capacitor array) untested, so if there are faults in this section, they aren't discovered until essentially the whole chip is assembled.

There is, thus, a need for a simple test which gives a high degree of confidence that at least all the analog parts of the ADOC are functioning properly prior to final assembly.

Accordingly, it is an object of the present invention to provide a method and apparatus for quickly testing the analog components of an ADC which is completely integrated onto a single chip with other components, without requiring the use of external calibrating voltages.

Another object of the present invention is to provide a self-testing circuit for an ADC which is completely self-contained and on the same chip with the ADC.

A further object of the present invention is to provide for the diagnostic testing of a successive approximation ADC with no requirement for use of precision external analog voltage sources.

Another object of the present invention is to provide for a quick self-test of a successive approximation ADC which tests the analog components of the converter while using only a digital input and output.

SUMMARY OF THE INVENTION

The invention provides a method and apparatus for implementation of a simple test for testing the analog components of an analog-to-digital converter (ADC) which requires only eight conversions for an eight-bit device. This test provides a high degree of confidence that at least all the analog parts of the ADC are functioning properly. A more extensive test of the digital components of the ADC converter may be conducted prior to final assembly of the chip.

Other objects and features of the invention will become apparent from the following detailed description and appended claims when considered in conjunction with the accompanying drawings.

BRIEF DESCRIPTION OF THE DRAWINGS

Embodiments of the invention have been chosen for purposes of illustration and description and are described with reference to the accompanying drawings, wherein.

Throughout the drawings, like numerals represent like elements.

DETAILED DESCRIPTION OF PREFERRED EMBODIMENTS

Figure 3:
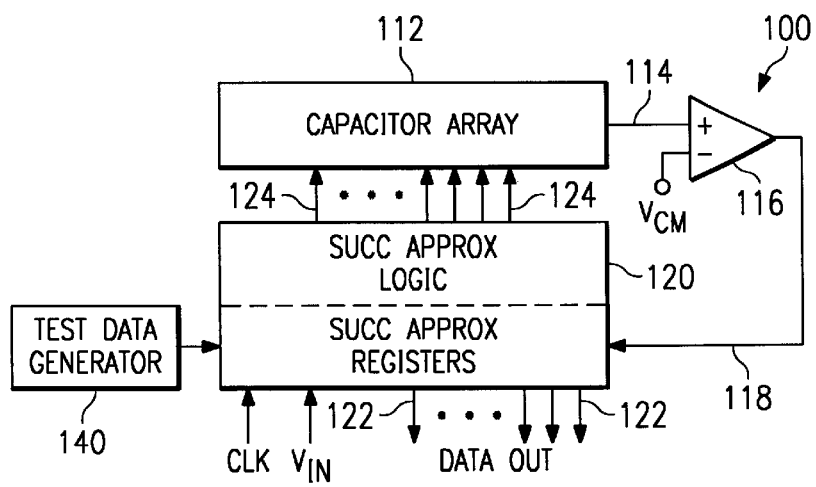
FIG. 3 is a block diagram of a successive approximation ADC according to an embodiment of the invention.
Figure 4:
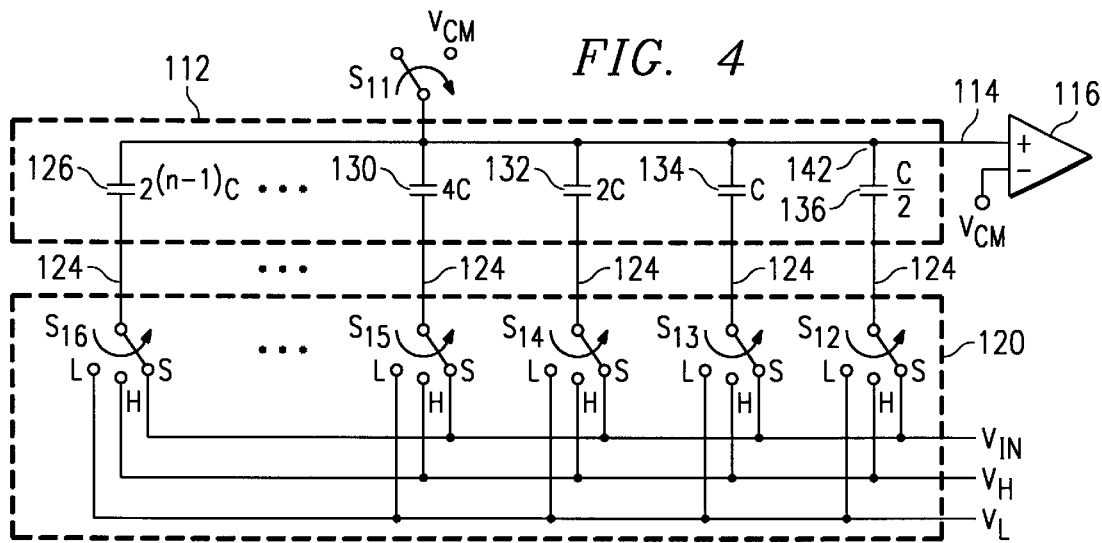
FIG. 4 is a schematic diagram of portions of the ADC of FIG. 3.
Figure 5:
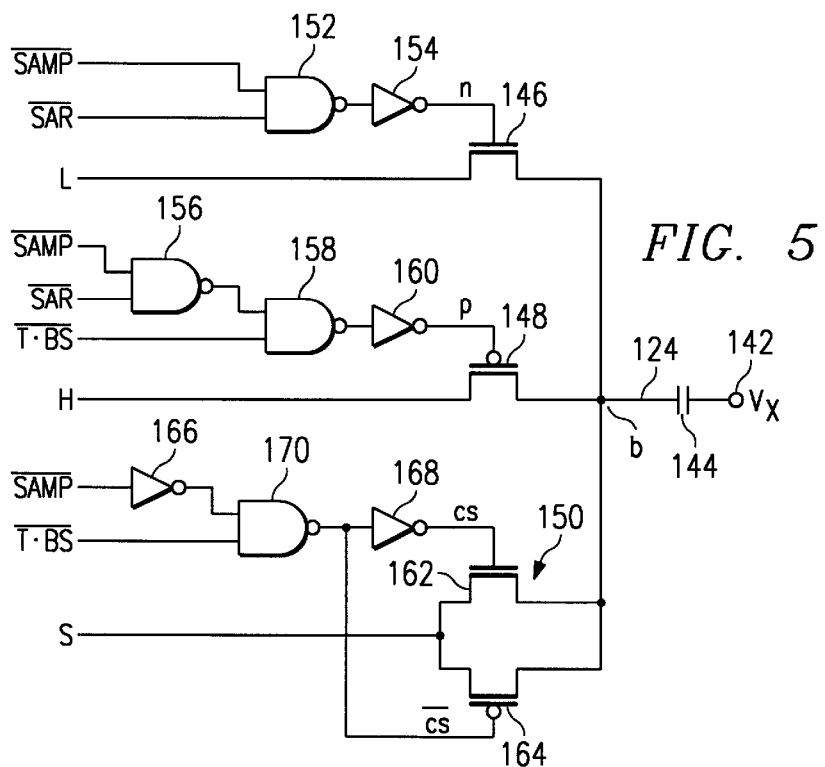
FIG. 5 shows switching logic usable in the ADC of FIGS. 3 and 4.

An example of a successive approximation, charge redistribution analog-to-digital converter (ADC) 100, for illustrating the principles of the invention, is shown in FIGS. 3–5. ADC 100 has a capacitor array 112 which is interconnected via conductor 114 to a comparator 116. The output 118 of comparator 116 is connected to successive approximation logic and register circuits 120 which activate, control and sequence switches S11–S16 via conductors 124 to produce the digital data bits output on DATA OUT lines 122.

As shown in FIG. 4, capacitor array 112 is comprised of a plurality of capacitors 126–136, connected in parallel. Capacitors 126–134 are binary weighted so that capacitor 134 corresponding to the least significant bit (LSB) has a value C, capacitor 132 corresponding to the next most significant bit (MSB) has a value 2C which is twice that of capacitor 134, capacitor 130 corresponding to the next bit has a value 4C which is twice that of capacitor 132, and so forth, until the nth capacitor 126 which has a value $2^{(n-1)}$ C, for the n-bit ADC 100. The additional capacitor 136 has a value C/2 which is one-half the value C of the LSB capacitor 134, for the illustrated embodiment.

Capacitors 126–136 all have their top plates commonly connected to node 142 at line 114 to the non-inverted input of comparator 116 and to switch S11 which, when open, is unconnected and, when closed, connects the top plates to the comparator common mode or clamp voltage (voltage connected to the inverted terminal of comparator 116) $V_{CM}$. The bottom plates of capacitors 126–136 are connected to switches S12–S16, respectively, which may alternately be connected to point L which is connected to a low voltage reference source $V_L$, point H which is connected to a high voltage reference source $V_H$, or S which is connected to receive the analog input signal voltage $V_{IN}$. $V_L$, may, for example, be ground. $V_H$ is a high voltage (for example, 5.0 volts) which can be internally generated or brought in through an external source. $V_H$ will typically be the maximum value expected for the input signal $V_{IN}$ voltage that will be converted into digital code. Common mode voltage $V_{CM}$ is internally generated.

For the indicated implementation, for sample mode, switch S11 is set to $V_{CM}$, and switches S13–S16 are set to points S to apply the input voltage $V_{IN}$ to the bottom plates of capacitors 126–134 having values $2^{(n-1)}C, \ldots, C$. Switch S12 is set to the H position to apply the high reference voltage $V_H$ to the C/2 value capacitor 136. Once the capacitors are charged (input signal has been sampled), for the hold mode, switch S11 is opened and switches S12–S16 are set to points L to apply the low reference voltage (viz. ground). This sets $V_X$ at node 142 on line 114 to the voltage $V_X = V_{CM} - V_{IN} - \frac{1}{2}$ LSB. The adjustment for one-half LSB comes from choosing the value of the extra capacitor 136 as C/2, which is one-half the C value of the LSB capacitor 134. Stray capacitance is neglected because it is just a gain factor on all the voltages and cancels out. A binary search is then performed, in redistribution mode, switching the bottom plates of binary weighted capacitors 126–134 similar to the process previously described for ADC 10 of FIGS. 1–2, until the value of $V_X$ at node 142 is brought as close as possible to $V_{CM}$ from below, that is, until the final $V_X = V_{CM}$. The search proceeds sequentially from capacitor 126 (value $2^{(n-1)}$ C) through capacitor 134 (value C) by switching each separate input from point L to point H. Each value of capacitance C, when switched from H to L, subtracts one analog equivalent of the digital LSB value from $V_X$. At each state, if $V_X > V_{CM}$, the switch is left at point H, else it is returned to point L. The final pattern (for example, HLHHLLHL for an eight-bit converter with H=1 and L=0) is the digital output conversion of the analog input, and is the best approximation of the ratio $V_{IN}/(V_H - V_L)$ for the particular word length. The frequency for application of the input signal $V_{IN}$ to the capacitor array is selectable via an analog input multiplexer MUX (MIG. 6) connected at the common input to the S switches. The analog equivalent of one LSB digital output value is $(V_H - V_L)/(2^{n-1})$.

In accordance with the invention, the generalized ADC circuit 100 incorporates on-board self-test features. A test data generator 140 acts, in test mode, to present a known digital word, n-bits wide, to circuit 100 during sampling. Generator 140 may comprise a programmable read-only memory or logic circuit, for example. The test word is applied to control the settings of bottom plate switches S13–S16. Instead of sampling a known external signal applied with switches S13–S16 set to points S, the pattern of 1's and 0's in the test word applied by generator 140 sets the switches so that a logic 1 bit position sets the corresponding bit position switch to H for application of the high reference voltage $V_H$, and a logic 0 bit position sets the corresponding bit position switch to L for application of the low reference voltage $V_L$. Switch S11 is closed to apply voltage $V_{CM}$ to node 142, and the input multiplexer MUX (FIG. 6) is disconnected from the input signal terminal and tied to L ($V_L$). Capacitors 126–134 will, thus, be charged in a sample phase of the test mode according to their connections to $V_H$ or $V_L$. During a hold phase, switch S11 is then opened and switches S13–S16 switched to their L points with $V_X$ changing at node 142 by an amount determined by which ones of switches S13–S16 were set to H. In this way, a predetermined test signal is applied to capacitor array 112, without the need to apply a precise known external analog signal. If, for example, bit position i of the test word is 1 and all other bits are 0, after sampling when all switches S13–S16 go to their L points with S11 opened, $V_X = V_{CM} - 2^i C / C_{TOT} \times V_H - \frac{1}{2}$ LSB, wherein $C_{TOT} = 2^i C + C_{STRAY}$. A usual successive approximation conversion is then performed during a redistribution phase of the test mode to determine the digital output word for the test pattern charged capacitor input. The output word from the ADC conversion is then compared for identity with the predetermined digital input word from generator 140. The two patterns should be the same.

The described procedure is a short and simple test, without the necessity for applying an external test signal, to determine proper functioning of capacitor array 112, comparator 116 and switches S11–Sl6, as well as the successive approximation logic and register circuitry 120. The test can, for example, be performed in eight sampling and conversion times for an eight-bit ADC. A test pattern, for example, of a 1 and seven 0's (switch 16 set to H; other switches S13–S15 set to L), can give a quick gross assessment of proper ADC operation. On-board test capability is especially advantageous for testing ADCs embedded with digital signal processors, microprocessors, or other components into a single integrated circuit configuration. Such simple test provides a quick way to check for major faults in analog components, for example, before engaging in more extensive testing of other elements. The successive approximation registers in circuit 120 used to provide the output digital conversion on DATA OUT lines 122 may be conveniently provided as digital input/output (I/O) cells into which the test pattern from generator 140 can be loaded. The test pattern can, thus, be checked at start of test for comparison with the conversion appearing at the same lines following the redistribution phase in test mode. Initiation of test mode (and, thus, loading of test data into the cells) can be initiated, for example, by asserting read (RD) and write (WR) control signals simultaneously for the sample period. The conversion sequence is then started with deassertion of WR, and data made available from assertion of RD. The test mode initiation can be latched to prevent bus congestion where VWR and RD are deasserted. Latch clearing can be set to occur upon receipt of the end of convert (EOC) signal.

FIG. 5 shows an example implementation for the successive approximation logic suitable for switches S13–S16 of ADC 100. Capacitor 144 can be any one of capacitors 126–134 and has its top plate connected to node 142. The bottom plate of capacitor 144 is connected via line 124 and switches 146, 148 and 152 to lines L, H and S, for receipt of voltages $V_L$, $V_H$ and $V_{IN}$, respectively. Switch 146 is an N-channel (NMOS) field effect transistor whose gate is controlled by serially connected NAND gate 152 and inverter 154 as indicated. Switch 148 is a P-channel (PMOS) field effect transistor whose gate is controlled by serially connected NAND gates 156, 158 and inverter 160, as indicated. Switch 150 is a combination N-channel and P-channel (CMOS) configuration of field effect transistors 162, 164 controlled by serially connected inverters 166, 168 and NAND gate 170, as indicated. The truth table for setting switches 146–150 is given in Table 1. During normal operation (test mode=0) the node b voltage applied at line 124 to the bottom plate of capacitor 144 (viz. any of capacitors 126–134) will be derived from the line S application of $V_{IN}$. The gate voltage n applied to switch 146 will, thus, be low and the gate voltage p applied to switch 148 will be high, disconnecting lines L and H from node b. The gate voltage cs applied at transistor 162 will be high and its inverse applied at transistor 164 will be low, connecting line s to node b. During normal operation, when the sample mode is complete and conversion is underway (sample=0), if the corresponding successive approximation register is set low, switch 146 will connect line L to node b and switches 148, 150 will disconnect lines H and S from node b. This is in accordance with the usual successive approximation procedure described previously.

When the test mode is enacted (test=1), the same sampling and conversion sequences will be modified to apply the L line to node b when the 0 bit is applied in the test pattern for that capacitor 144, and to apply the H line to node b when the 1 bit is applied.

TABLE 1.0

Truth Table for Switches S13–S16

| Logic Signals | | | | Switch | | | |
| --- | --- | --- | --- | --- | --- | --- | --- |
| | Test | | | Node V | Control Signals | | |
| Test | Bit | Sample | SAR | b | n | p | cs |
| 0 | X | 1 | X | S | 0 | 1 | 1 |
| | | 0 | 0 | L | 1 | 1 | 0 |
| | | 0 | 1 | H | 0 | 0 | 0 |
| 1 | 0 | 1 | X | L | 1 | 1 | 0 |
| | | 0 | 0 | L | 1 | 1 | 0 |
| | | 0 | 1 | H | 0 | 0 | 0 |
| 1 | 1 | 1 | X | H | 0 | 0 | 0 |
| | | 0 | 0 | L | 1 | 1 | 0 |
| | | 0 | 1 | H | 0 | 0 | 0 |

Figure 6:
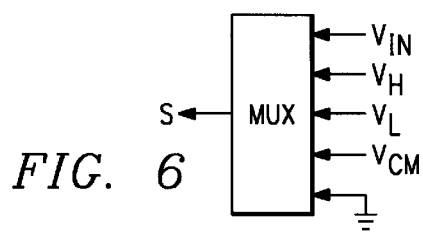
FIG. 6 shows is a block diagram for an alternate arrangement.

Test data generator 140, as indicated, can be used to apply the test pattern sequences from on-board storage or generation. Alternatively, the test patterns can be read from an external source. This has the advantage that the test sequence can be varied to suit particular applications, as needed. The successive approximation logic shown in FIG. 5 controls the gate voltages of the transistors so that the N-channel and P-channel transistors 146, 148 are turned off during normal operation sampling mode, and transistors 162, 164 are turned on to let the analog input signal $V_{IN}$ go to the bottom plates of the capacitors. Then, during the successive approximation procedure, transistors 148, 162, 164 are turned off and transistor 146 is turned on to initially connect all capacitors to the $V_L$ voltage on signal line L. With each test of a capacitor thereafter, the transistor 146 is turned off and transistor 148 is turned on to apply the high voltage $V_H$ of Line H. For the test mode, rather than sampling using the S line, the switches of all bit 1 pattern position capacitors are set to connect the $V_H$ signal of line H to the bottom plate of the capacitor. If a particular capacitor is not selected or given a 0 bit pattern position, its operation can be left the same as during normal operation, provided that instead of applying an external signal on line S, the low voltage reference $V_L$ is applied. This can be done by applying a multiplexer as indicated in FIG. 6 which switches from the $V_{IN}$ to the $V_L$ input for the selected 0 bit capacitor positions.

Open capacitor connections are also detectable by means of the digital test pattern approach. For example, if an input code 0010 . . . 0 is applied and the second position capacitor is open, the output code will be 01 followed by indeterminate 1's or 0's in the remaining positions. In this case, the high most significant bit will show up as faulty. The open capacitor will remain in the 1 position during conversion because it does not shift $V_X$ by much. This will hold for all capacitors except the smallest. It will also serve to detect multiple opens. Another fault that is detectable is where all capacitors are open. Here an input code of 0 . . . 0 will give an output code with 1's or 0's in all the positions. Typically, in this case, none of the capacitors will contribute to $V_X$ and the output will be a random pattern of 1's and 0's instead of being a mostly all 0's pattern. Use of the multiplexer of FIG. 6 can also be used to test the S switch. The switch can be set to sample different inputs $V_{IN}$, $V_H$, $V_L$, $V_{CM}$ and/or ground, as indicated. The output codes should be close to 0 . . . 0, 1 . . . 1, and 01000 . . . The outputs need not be precise to determine that the switching is working satisfactorily. The value of $V_{CM}$ is not known precisely and the output is expected in a range of values from 2–3 volts, for example. The additional tests here involve three additional conversions. These tests also check for open L switches and for open S switches. This then leaves only the offset cancellation that may not be tested with high accuracy. The additional circuitry is a four-way input multiplexer. The switches 20, $V_{CM}$ and 5-volts can be small and can use more time for sampling during the test mode. Typically, sampling time is determined by external control signals and lengthening it does not require added circuitry.

Figure 1:
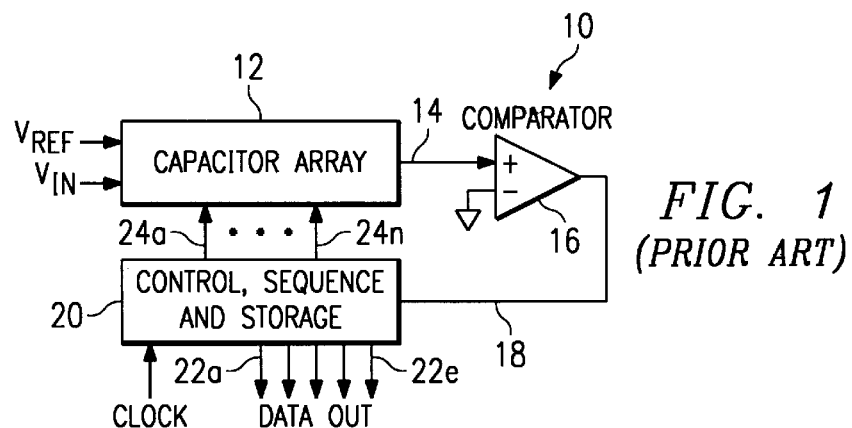
FIG. 1 is a block diagram of a successive approximation analog-to-digital converter (ADC) according to the prior art.
Figure 2:
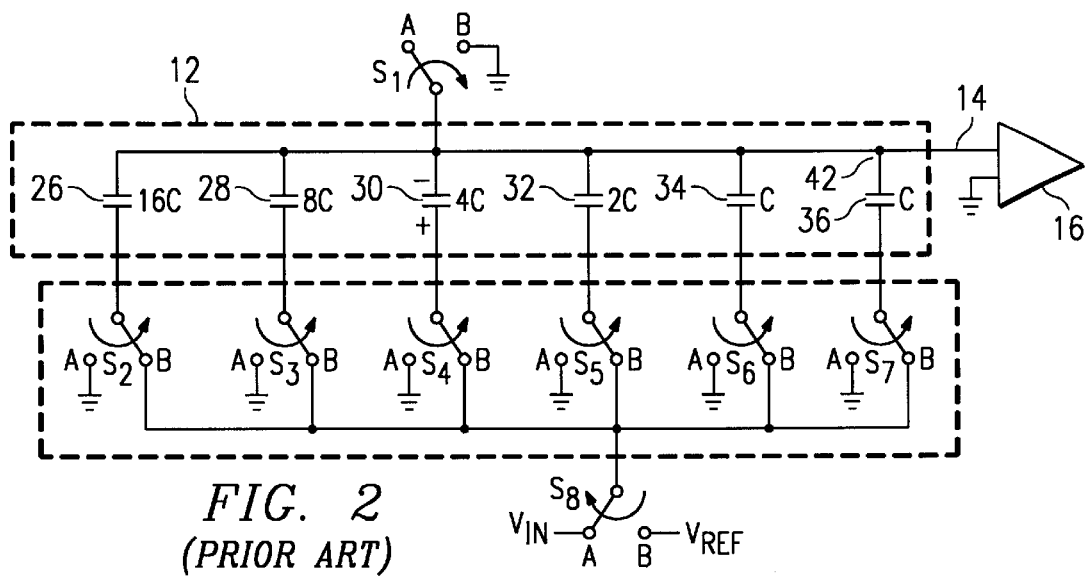
FIG. 2 is a schematic diagram of portions of the ADC of FIG. 1.

Those skilled in the art to which the invention relates will of course appreciate that the three–way switching circuits S12–S16 can be replaced by two-way switching circuits such as done in the circuitry of FIGS. 1 and 2. It will also be appreciated that other additions and modifications may also be made to the described examples, above, without departing from the spirit and scope of the invention as defined by the claims.

What is claimed is:

1. A method of testing a charge redistribution analog-to-digital converter; the converter having a binary weighted capacitor array with a plurality of capacitors, each capacitor having a pair of plate, one plate of each capacitor being electrically connected to a common node, a comparator having one input electrically connected to the common node and having an output, and successive approximation logic circuitry electrically connected to the comparator output and the array for selectively connecting the capacitors to one of a high reference voltage, low reference voltage or analog input signal voltage to develop a digital output in a successive charge redistribution conversion process comprising sample, hold and charge redistribution phases; the test method comprising on a single semiconductor chip:

providing a test generator for generating a test pattern sequence in the form of a digital signal;

connecting said common node to a common mode voltage and concurrently therewith selectively connecting the other plate of each capacitor to one of the high or low reference voltage to charge the capacitors according to a predetermined test pattern sequence provided by said test generator during the sample phase, said logic circuitry responsive to said test pattern sequence for connecting said plates of said capacitor to one of the high or low reference voltage;

then disconnecting said common node from said common mode voltage and concurrently commonly connecting said other plate of each capacitor to the low reference voltage during a hold phase;

then returning said common node to said common mode voltage to provide a digital output; and comparing said digital output to an expected output for the predetermined test pattern sequence which is the original test pattern sequence.

2. The method of claim 1, wherein the selectively connecting step comprises providing switches connected to the capacitors, and respectively setting the switches according to a digital test pattern sequence.

3. The method of claim 2, wherein the digital test pattern sequence is a prestored sequence read from a memory.

4. A method of testing a charge redistribution analog-to-digital converter with on-board self-test capability, comprising the steps of, on a single semiconductor chip:

providing a binary weighted capacitor array having a plurality of capacitors, each capacitor having a pair of plates, one plate of each of the capacitors being electrically connected to a common node;

providing a comparator having one input electrically connected to the common node and having an output;

providing successive approximation logic circuitry electrically connected to the comparator output and the array for selectively connecting the capacitors to preselected voltages in an analog-to-digital conversion cycle comprising sample, hold and charge redistribution phases;

providing logic circuitry for control of the other plate of each of said capacitors;

commonly connecting said other plate of each of said capacitors under control of said logic circuitry to an analog input signal during the sample phase while connecting said common node to an internally generated common mode voltage to charge said capacitors in accordance with a sample signal;

then commonly connecting the other plate to a low reference voltage under control of said logic circuitry during the hold phase while concurrently disconnecting said common node from said common mode voltage;

then successively connecting the other plate to the other of the high or low reference voltage during the charge redistribution phase under control of said logic circuitry;

providing a test data generator for generating a test pattern sequence in the form of a digital signal; and electrically connecting the test data generator to the logic circuitry for selectively controlling the logic circuitry to connect said other plate of each of the capacitors to one or the other of the high or low reference voltage to charge the capacitors according to said predetermined test pattern sequence during the sample phase of a test mode.

5. The method of claim 4 wherein the step (d) of connecting said other plate of each of the capacitors under control of said logic circuitry to an analog input signal during the sample phase while connecting said common node to an internally generated common mode voltage to charge said capacitors in accordance with a sample signal is a common connection.

6. The method of claim 5, wherein the selectively connecting step comprises providing switches connected to the capacitors, and respectively setting the switches according to a digital test pattern sequence.

7. The method of claim 6, wherein the digital test pattern sequence is a prestored sequence read from a memory.

8. The method of claim 4, wherein the selectively connecting step comprises providing switches connected to the capacitors, and respectively setting the switches according to a digital test pattern sequence.

9. The method of claim 8, wherein the digital test pattern sequence is a prestored sequence read from a memory.

10. A method of testing a charge redistribution analog-to-digital converter; the converter having a binary weighted capacitor array with a plurality of capacitors, each capacitor having a pair of plates, one plate of each capacitor being electrically connected to a common node, a comparator having one input electrically connected to the common node and having an output, and successive approximation logic circuitry electrically connected to the comparator output and the array including a plurality of switches respectively associated with the capacitors for selectively connecting the capacitor to a high reference voltage, low reference voltage or analog input signal voltage to develop a digital output according to the settings of the switches in a successive charge redistribution conversion process comprsing sample, hold and charge redistribution phases; the test method comprising the steps of, on a single semiconductor chip:

providing a test generator for providing a digital test pattern binary data bit sequence;

in the sample phase, setting the switches according to respective corresponding bits in the sequence of the digital test pattern to connect said other plate of each capacitor to one or the other of the high or low reference voltage to charge the capacitors according to the switch settings established by the test pattern;

in the hold phase, then setting the switches to commonly connect said other plate of each capacitor to the same one of the high or low reference voltage;

in the redistribution phase, then successively resetting the switches to connect said other plate to the same other of the high or low reference voltage;

developing an output digital binary data bit sequence based on the settings of the switches at the completion of the charge redistribution phase; and comparing the output digital binary data bit sequence with the digital test pattern binary data bit sequence.

* * * * *